US012640702B2

(12) United States Patent
Beck et al.

(10) Patent No.: US 12,640,702 B2
(45) Date of Patent: May 26, 2026

(54) JOSEPHSON WIDE BAND MULTIPLEXER-DEMULTIPLEXER CIRCUIT

(71) Applicant: INTERNATIONAL BUSINESS MACHINES CORPORATION, Armonk, NY (US)

(72) Inventors: Matthew Beck, Danbury, CT (US); Joseph Allen Glick, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1010 days.

(21) Appl. No.: 17/067,518

(22) Filed: Oct. 9, 2020

(65) Prior Publication Data

US 2022/0115577 A1    Apr. 14, 2022

(51) Int. Cl.
*H03H 7/46* (2006.01)
*G06N 10/40* (2022.01)
(Continued)

(52) U.S. Cl.
CPC ............... *H03H 7/46* (2013.01); *G06N 10/40* (2022.01); *H03H 7/0123* (2013.01); *H03H 7/09* (2013.01);
(Continued)

(58) Field of Classification Search
CPC .......... H03H 7/46; H03H 7/0123; H03H 7/09; H03H 7/1775; H03H 7/465; H03H 7/463; G06N 10/40; H10N 60/12; H10N 60/805
See application file for complete search history.

(56) References Cited

U.S. PATENT DOCUMENTS

| | | | |
|---|---|---|---|
| 3,764,905 A | 10/1973 | Zappe | |
| 4,533,840 A | 8/1985 | Gheewala et al. | |

(Continued)

FOREIGN PATENT DOCUMENTS

| | | | |
|---|---|---|---|
| CN | 1184930 A | 6/1998 | |
| CN | 1067768 C | 6/2001 | |

(Continued)

OTHER PUBLICATIONS

O. Naaman; M. O. Abutaleb; C. Kirby; M. Rennie; On-chip Josephson junction microwave switch; Appl. Phys. Lett. 108, 112601 (2016) (Year: 2016).*

(Continued)

*Primary Examiner* — Aaron J Gray

(74) *Attorney, Agent, or Firm* — Amin, Turocy & Watson, LLP

(57) ABSTRACT

A superconducting circuit includes a first port and a plurality of second ports; a plurality of filter poles, each filter pole comprising an inductor and a capacitor connected in parallel, between the first port and a second port in the plurality of second ports; an admittance inverter comprising at least one of a coupling capacitor, a coupling inductor, and a Josephson junction, the admittance inverter linking two successive filter poles together. The plurality of filter poles and associated admittance inverters define a plurality of current branches so that, when operating as a demultiplexer, an input electrical current input though the first port is routed to a selected one of the plurality of the plurality of second ports by an application of a first set of magnetic flux biases.

16 Claims, 9 Drawing Sheets

(51) Int. Cl.

| | | |
|---|---|---|
| *H03H 7/01* | (2006.01) |
| *H03H 7/09* | (2006.01) |
| *H10N 60/12* | (2023.01) |
| *H10N 60/80* | (2023.01) |

(52) U.S. Cl.
CPC .......... *H03H 7/1775* (2013.01); *H03H 7/465* (2013.01); *H10N 60/12* (2023.02); *H10N 60/805* (2023.02)

(56) References Cited

U.S. PATENT DOCUMENTS

| | | | | |
|---|---|---|---|---|
| 9,768,771 | B2 | 9/2017 | Naaman | |
| 9,917,580 | B2 | 3/2018 | Naaman | |
| 10,164,606 | B1 * | 12/2018 | Keane | H10N 60/12 |
| 10,505,097 | B1 | 12/2019 | Inamdar et al. | |
| 2017/0033815 | A1 * | 2/2017 | Leipold | H04B 1/0057 |
| 2019/0385088 | A1 | 12/2019 | Naaman et al. | |

FOREIGN PATENT DOCUMENTS

| | | | |
|---|---|---|---|
| CN | 101059556 | A | 10/2007 |
| CN | 109062597 | A | 12/2018 |
| JP | 2011-524131 | A | 8/2011 |
| JP | 2019-530336 | A | 10/2019 |
| WO | 2019236137 | A2 | 12/2019 |

OTHER PUBLICATIONS

Examination Report No. 1 received for Australian Patent Application Serial No. 2021356089 dated Aug. 31, 2023, 3 pages.
Response to the Communication pursuant to Rules 161(1) and 162 EPC received for European Patent Application Serial No. EP21786961.9 dated Nov. 27, 2023, 4 pages.
Naaman O et al., "On-chip Josephson junction microwave switch", Applied Physics Letters, American Institute of Physics, vol. 108, No. 11, Mar. 14, 2016, pp. 112601-1-112601-4, XPO12205944.
Naaman O et al., "On-chip Josephson junction microwave switch", arXiv: 1512.01484v1[cond-mat.sur-con] Dec. 4, 2015.
PCT/EP2021/077524 International Search Report mailed Mar. 28, 2022.
PCT/EP2021/077524 Written Opinion mailed Mar. 28, 2022.
Invitation to Pay Additional Fees received for International PCT Application Serial No. PCT/EP2021/077524 dated Feb. 7, 2022, 14 pages.
Pechal et al., "Superconducting Switch for Fast On-Chip Routing of Quantum Microwave Fields", Physical Review Applied, vol. 6, 2016, pp. 024009-1-024009-8.
Sliwa et al., "Reconfigurable Josephson Circulator/Directional Amplifier", Physical Review X, vol. 5, 2015, pp. 041020-1-041020-10.
Hornibrook et al., "Cryogenic Control Architecture for Large-Scale Quantum Computing", Physical Review Applied, vol. 3, 2015, pp. 024010-1-024010-9.
Attar et al., "Low Temperature Superconducting RF MEMS Devices", IEEE Transactions on Applied Superconductivity, vol. 23, No. 3, Jun. 2013, 4 pages.
Namaan et al., Appl. Phys. Lett. 108, 112601 (2016).
Abdo, B. et al., Nature Comm. 10, 3154 (2019).
Japanese Patent Office "Notice of Reasons for Refusal" Feb. 25, 2025, Japanese Patent Application No. 2023-515332, 7 pages.

* cited by examiner

JOSEPHSON WIDE BAND MULTIPLEXER-DEMULTIPLEXER CIRCUIT

BACKGROUND

The currently claimed embodiments of the present invention relate to superconducting circuits, and more specifically, to a Josephson wide band multiplexer/demultiplexer circuit and a quantum mechanical computer using the same.

The ability to rapidly test quantum computing hardware in a single cool down of a dilution refrigerator (DR) of a superconducting quantum computer relies on ability to multiplex or demultiplex microwave signals from/to different paths. Current techniques in increasing microwave fanout typically involve the modification of commercially available hardware to operate in the milli-Kelvin (mK) environment of the DR. Even with these modifications, however, this commercial hardware is intrinsically noisy being comprised of non-superconducting materials. In addition, the generally employed mechanical switching between channels introduces non-negligible transient heat load. This necessarily imposes slow operation as re-thermalization of the DR mK stage must be achieved after every channel switching event. In addition, current techniques utilizing electro-mechanical microwave relays typically have a large physical footprint and are not amenable to scaling-up quantum computers to a very large number of qubits.

Therefore, it would be desirable to solve this and other problems of the prior art by providing a new kind of switch with similar or better physical characteristics to that in state of the art implementations, but provide a switch that is scalable and dissipates a negligible amount of heat. Indeed, quantum computers, in particular, need fast, broadband, small size, energy efficient switches for multiplexing and isolation, particularly at lower temperature stages (1K-10 mK); readout of many channels; flexible and reconfigurable cryogenic test infrastructure enabling future integration of cryogenic control and readout electronics; reduction of a number of wires, heat-load, etc. to enable scaling-up the number of qubits in future quantum computers, etc.

SUMMARY

An aspect of the present invention is to provide a superconducting circuit. The circuit includes a first port and a plurality of second ports; a plurality of filter poles, each filter pole comprising an inductor and a capacitor connected in parallel, between the first port and a second port in the plurality of second ports; an admittance inverter comprising at least one of a coupling capacitor, a coupling inductor, and a Josephson junction, the admittance inverter linking two successive filter poles together. At least one filter pole of the plurality of filter poles together with the admittance inverter define a current branch (IB). The plurality of filter poles and associated admittance inverters define a plurality of current branches so that, when operating as a demultiplexer, an input electrical current input though the first port is routed to a selected one of the plurality of second ports by an application of a first set of magnetic flux biases, and when operating as a multiplexer, an input electrical current input through any one of the plurality of second ports is routed as an output electrical current output through the first port by the application of a second set of magnetic flux biases.

In an embodiment, during operation as a demultiplexer, the first set of magnetic flux biases is applied to match a current output through the selected one of the plurality of second ports to the current input through the first port, and all remaining not-selected ones of the plurality of second ports are mismatched from the first port and have essentially zero transmission.

In an embodiment, the inductor and the capacitor in each filter pole are connected to electrical ground and to the Josephson junction and to the coupling capacitor of adjacent admittance inverters. In an embodiment, the coupling capacitor is configured to decouple two poles from direct current (DC). In an embodiment, the current branch comprises one pole or two poles.

In an embodiment, a number of second ports is dependent on a number of current branches. In an embodiment, the plurality of second ports is equal to N/2, where N–1 is a number of total current branches.

In an embodiment, a number of the plurality of second ports is equal to $2^{P/2}$, where P is a number of poles in an arm from the first port to a second port in the plurality of second ports, for an even number P of filter poles.

In an embodiment, the first port is connected to a first current branch having a first filter pole and each of the plurality of second ports is connected to a corresponding second current branch having a corresponding second pole.

In an embodiment, the first port is connected to the first current branch via a first capacitor and each of the plurality of second ports is connected to the second current branch via a corresponding second capacitor.

In an embodiment, each of the plurality of current branches in an arm from the first port to a second port in the plurality of second ports is configured to operate in a selected frequency range based on selected operating parameters. In an embodiment, the selected frequency range is from 4 GHz to 8 GHz.

In an embodiment, when a current is input through the first port, the current is selectively transmitted to a second port in the plurality of second ports by applying external flux biases.

In an embodiment, an impedance of the plurality of filter poles is selected such that a beta-L coefficient ($\beta_L$) of each superconducting quantum interference device (SQUID) loop including the Josephson junction and an inductor is less than one, wherein $\beta_L = 2\pi * I_c * L / \Phi_0$, where L is the geometric inductance of the SQUID, Ic is the critical current of the coupling JJ, and $\Phi_0$ is a superconducting magnetic flux quantum.

In an embodiment, an impedance at the first port is matched with the impedance of each of the plurality of second ports. In an embodiment, the impedance at the first port is not matched with the impedance of each of the plurality of second ports.

An aspect of the present invention is to provide a superconducting quantum computer. The superconducting quantum computer includes a refrigeration system having a temperature-controlled vessel; a quantum processor disposed within the temperature-controlled vessel, the quantum processor comprising a plurality of qubits; and a superconducting circuit disposed inside the temperature-controlled vessel. The circuit includes a first port and a plurality of second ports; a plurality of filter poles, each filter pole comprising an inductor and a capacitor connected in parallel, between the first port and a second port in the plurality of second ports; an admittance inverter comprising at least one of a coupling capacitor, a coupling inductor, and a Josephson junction, the admittance inverter linking two successive filter poles together. At least one filter pole of the plurality of filter poles together with the admittance inverter define a current branch (IB). The plurality of filter poles and associated admittance inverters define a plurality of current branches so that, when operating as a demultiplexer, an input electrical current input though the first port is routed to a selected one of the plurality of the plurality of second ports by an application a first set of magnetic flux biases, and when operating as a multiplexer, an input electrical current input through any one of the plurality of second ports is routed as an output electrical current output through the first port by the application of a second set of magnetic flux biases. Each of the plurality of second ports is connected to a corresponding qubit of the plurality of qubits to control or read a state of the corresponding qubit.

In an embodiment, during operation as a demultiplexer, the first set of magnetic flux biases are applied to match a current output through the selected one of the plurality of second ports to the current input through the first port, and all remaining not-selected ones of the plurality of second ports are mismatched from the first port and have essentially zero transmission.

In an embodiment, when a current is input through the first port, the current is selectively transmitted to a second port in the plurality of second ports by applying the first set of magnetic flux biases.

A further aspect of the present invention is to provide a superconducting network circuit. The superconducting network circuit includes a first superconducting circuit having a first port and a plurality (N) of second ports to provide a 1 to N switch configuration; a plurality of filter poles, each filter pole comprising an inductor and a capacitor connected in parallel, between the first port and a second port in the plurality of second ports; an admittance inverter comprising at least one of a coupling capacitor, a coupling inductor, and a Josephson junction, the admittance inverter linking two successive filter poles together. At least one filter pole of the plurality of filter poles together with the admittance inverter define a current branch (IB). The plurality of filter poles and associated admittance inverters define a plurality of current branches so that, when operating as a demultiplexer, an input electrical current input though the first port is routed to a selected one of the plurality (N) of second ports by an application of a first set of magnetic flux biases. The superconducting network circuit includes a second superconducting circuit having a third port and a plurality (M) of fourth ports to provide a 1 to M switch configuration; a plurality of filter poles, each filter pole comprising an inductor and a capacitor connected in parallel, between the third port and a fourth port in the plurality of fourth ports; an admittance inverter comprising at least one of a coupling capacitor, a coupling inductor, and a Josephson junction, the admittance inverter linking two successive filter poles together. At least one filter pole of the plurality of filter poles together with the admittance inverter define a current branch (IB). The plurality of filter poles and associated admittance inverters define a plurality of current branches so that, when operating as a multiplexer, an input electrical current input through any one of the plurality (M) of fourth ports is routed as an output electrical current output through the third port by the application of a second set of magnetic flux biases. The first port of the first superconducting circuit is connected to the third port of the second superconducting circuit so as to provide a M to N switch matrix.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
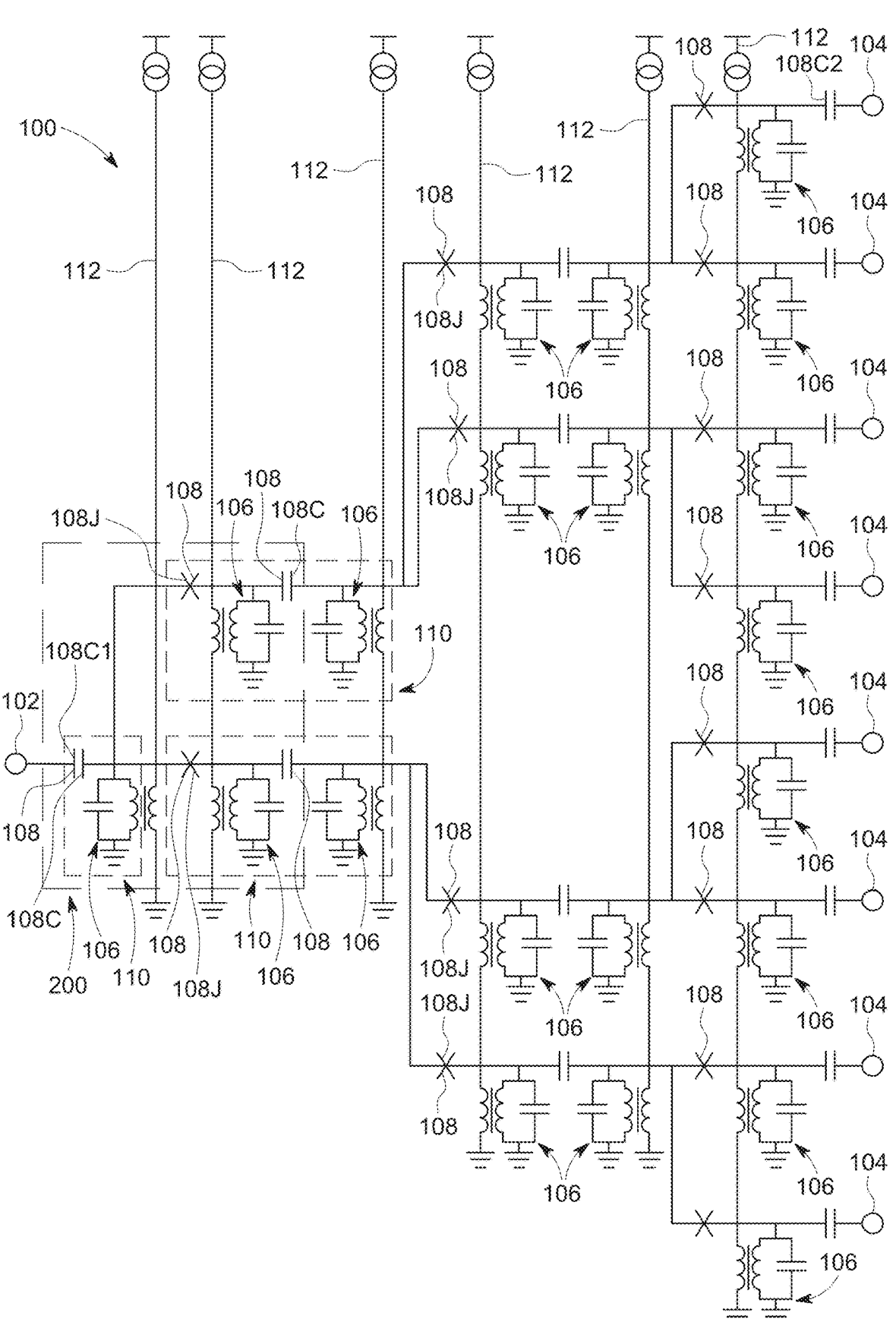
FIG. 1 is an electronic schematic of a superconducting circuit, according to an embodiment of the present invention.

FIG. 1 is an electronic schematic of a superconducting circuit, according to an embodiment of the present invention. The superconducting circuit 100 includes a first port 102 and a plurality of second ports 104. The superconducting circuit 100 also includes a plurality of filter poles 106. Each filter pole 106 includes an inductor 106A and a capacitor 106B (shown in FIG. 2) connected in parallel, between the first port 102 and a second port 104 in the plurality of second ports 104. The circuit 100 also includes an admittance inverter 108. The admittance inverter 108 includes one of a coupling capacitor 108C, a coupling inductor 112A, and a Josephson junction (JJ) 108J (also shown in FIG. 2). The admittance inverter 108 links two successive filter poles 106 together. In an embodiment, the admittance inverters are of the "pi" variety with the negative shunt reactive components absorbed into the surrounding pole capacitors and/or inductors.

Figure 2:
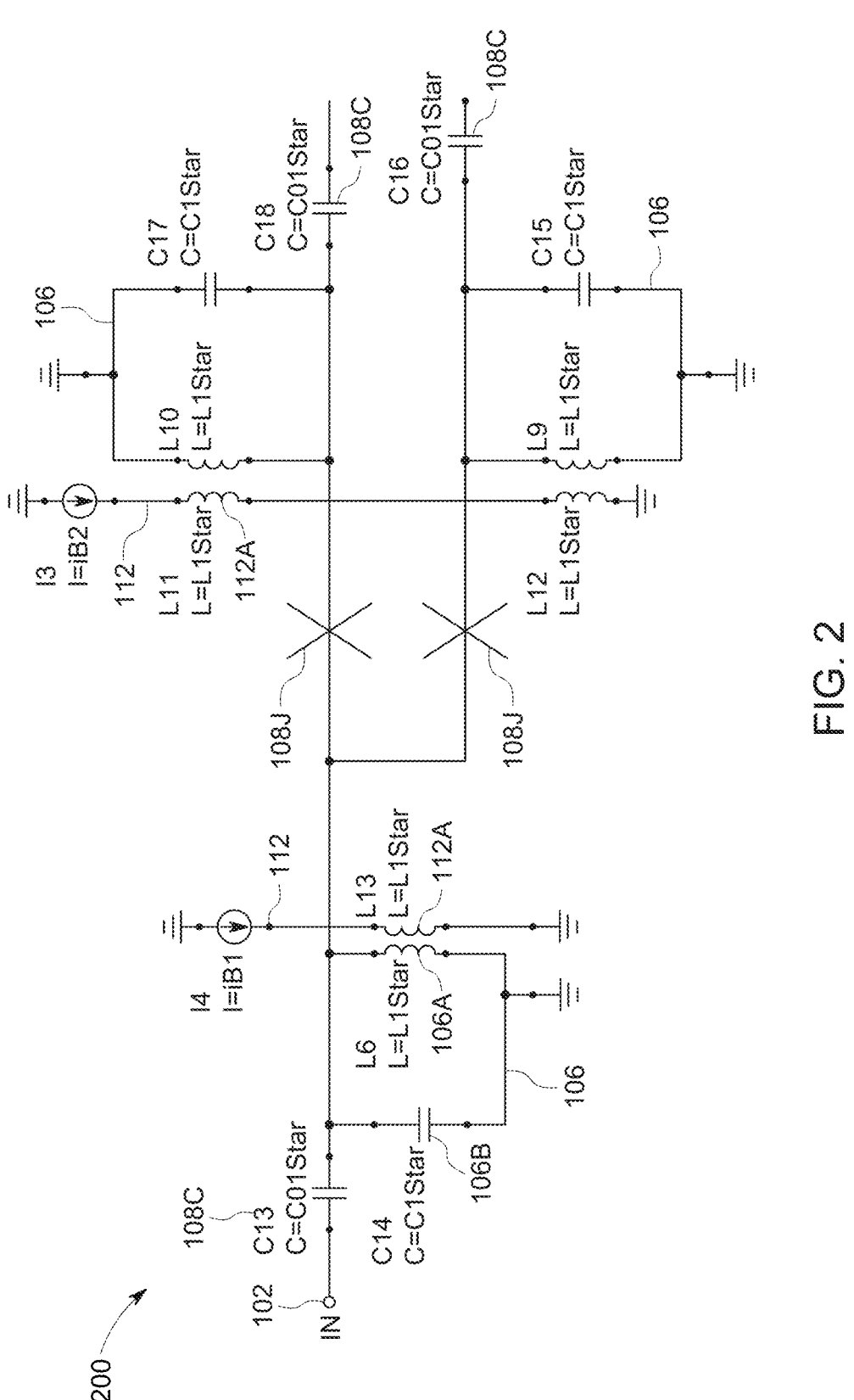
FIG. 2 shows an enlarged portion of the circuit shown in FIG. 1, according to an embodiment of the present invention.

FIG. 2 shows an enlarged portion 200 of circuit 100, according to an embodiment of the present invention. As shown in more detail in FIG. 2, each filter pole 106 has the inductor 106A and the capacitor 106B connected in parallel. The Josephson junction 108J links two successive filter poles 106 together. The capacitor 108C (C13) links the filter pole 106 to the input port 102. The capacitor 108C (C16 and C18) links one filter pole 106 to another filter pole 106 (not shown in FIG. 2).

In an embodiment, as shown in more detail in FIG. 2, the inductor 106A and the capacitor 106B in each filter pole 106 are connected to electrical ground and to the Josephson junction 108J and to the coupling capacitors 108C of adjacent admittance inverters 108. In an embodiment, the coupling capacitor 108 is provided to decouple two filter poles from direct current (DC). The coupling capacitor 108C provided for example between the first port 102 and the left most filter pole 106. Another coupling capacitor 108C can also be provided between two adjacent filter poles 106.

As shown in FIG. 1, at least one filter pole 106 of the plurality of filter poles 106 together with the admittance inverter 108 define a current branch (IB) 110. For example, the current branch 110 that is directly connected to the input port 102 has one filter pole (first filter pole) while the current branches 110 that are connected to the first filter pole 106 via the Josephson junctions 108J have two filter poles 106.

The plurality of filter poles 106 and associated admittance inverters 108 define a plurality of current branches 110 so that, when operating as a demultiplexer, an input electrical current input though the first port 102 is routed to a selected one of the plurality of the plurality of second ports 104 by an application of a first set of a magnetic flux biases, and when operating as a multiplexer, an input electrical current input through any one of the plurality of second ports 104 is routed as an output electrical current output through the first port 102 by the application of a second set of the magnetic flux biases.

As illustrated in FIG. 2, the magnetic flux bias is generated by inputting a bias DC current through DC control line 112 which is inductively coupled to the inductor 106A of each pole filter 106 via the coupling inductor 112A. In an embodiment, controlled operation of the circuit uses DC flux bias lines and relatively fast (1 GHz Bandwidth) control lines. The flux bias control line on the left hand side (I4+L13) sets a DC flux bias offset that pushes current through both JJs 108A. At this point the circuit does not work because each JJ is current biased away from it's nominal operating point. The user then pushes flux into the latter half of the circuit using I3, L11, and L12 which either counteracts the DC offset current in the upper JJ 108A while adding more bias current in the lower JJ or vice versa depending on the sign of the current from I3.

Figure 3A:
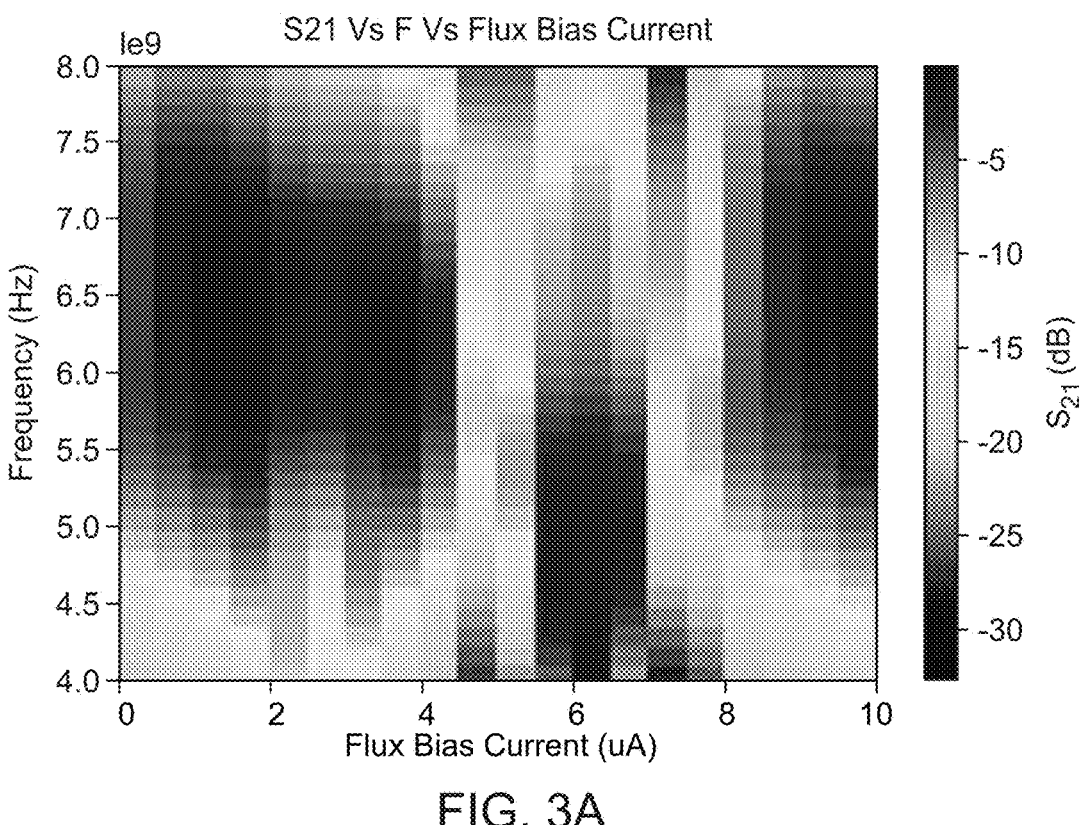
FIGS. 3A and 3B show plots of simulations of the circuit shown in FIG. 2, according to an embodiment of the present invention.
Figure 3B:
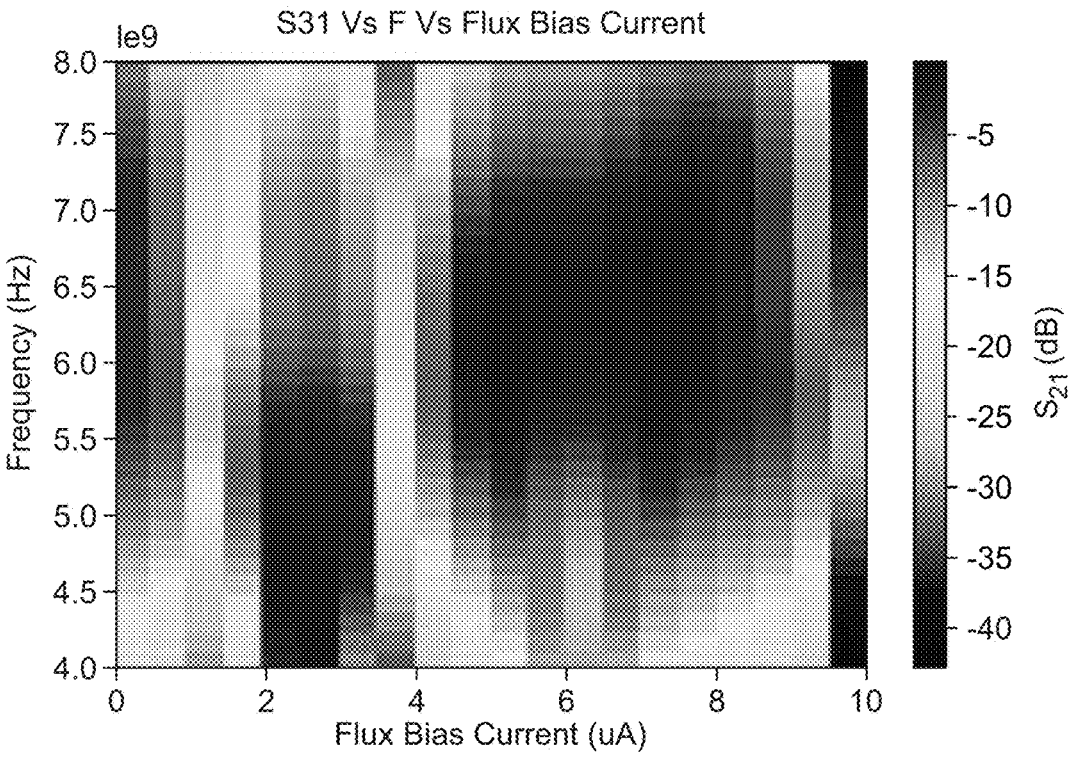

FIGS. 3A and 3B show plots of simulations of the circuit 200, according to an embodiment of the present invention. The vertical axis represents the frequency (in Hz) and the horizontal axis represents the flux bias current (in υA) corresponding to the second flux bias current (I3, L11, and L12). FIG. 3A shows the scattering parameter S21 in dB as a function of both frequency and flux bias current and FIG. 3B shows the scattering parameter S31 in dB as a function of both frequency and flux bias current. This simulation predicts that as the current in the AC flux bias line (input) is varied, the amount of isolation between the "On" and the "Off" state of the two channels (outputs) can be controllably varied by at least 20 dB, and in the "On" state has near unity transmission within the desired frequency band (for example, between 6 GHz and 7 GHz). The circuits 100, 200 operate in a reversible manner, meaning it can be used either as a multiplexer or a demultiplexer depending on the designation of the first port and second ports, with approximately the same level of performance in either configuration. That is, the first port 102 can operate as an input port while the second ports 104 as output ports and one of the second ports 104 can also operate as an input port while the first port 102 operate as an output port.

In an embodiment, during operation as a demultiplexer, the magnetic flux bias is applied (via the DC induction line 112). Specifically, during operation, flux bias current I4 sets an offset flux for the circuit while flux bias current I3 is supplying a flux to decrease the offset flux in one channel while adding to it in another depending on the sign of the current supplied from the flux bias current I3 so as to match a current output through the selected one of the plurality of second ports 104 to the current input through the first port 102, while all remaining not-selected ones of the plurality of second ports 104 are mismatched from the first port 102 and have essentially zero transmission. For example, the second port (output port) 104 at the top in FIG. 1 can be selected to match the first port (input port) 102 to deliver an output current while all remaining output ports 104 are mismatched with the first port (input port) 102 and thus have essentially zero transmission and deliver zero current.

In an embodiment, a number of second ports 104 is dependent on a number of current branches (IB) 110. The number of second ports is equal to N/2, where N−1 is a number of total current branches. For example, in the embodiment shown in FIG. 1, the number of total current branches is 15 and thus the number of second ports 104 is 8.

In an embodiment, the number of second ports 104 can also be calculated based on the number of filter poles 106. Specifically, a number of the plurality of second ports 104 is equal to $2^{P/2}$, where P is a number of filter poles 106 in an arm from the first port 102 to a second port 104 in the plurality of second ports 104, for an even number P of filter poles 106. For example, in the embodiment shown in FIG. 1, the number of poles 106 in an arm (upper arm for example) is equal to 6, therefore, the number of second ports (output ports) 104 is equal to $2^3$, i.e., 8.

In an embodiment, the first port 102 is connected to a first current branch 110 having a first filter pole 106 and each of the plurality of second ports 104 is connected to a corresponding second current branch 110 having a corresponding second pole 106.

In an embodiment, the first port 102 is connected to the first current branch 110 via a first capacitor 108C1 and each of the plurality of second ports 104 is connected to the second current branch 110 via a corresponding second capacitor 108C2.

In an embodiment, when a current is input through the first port 102, the current is selectively transmitted to a second port 104 in the plurality of second ports 104 by applying controlled magnetic flux biases. The controlled DC offset flux bias is delivered through DC control line 112 which is inductively coupled to the inductor 106A of each pole filter 106 via the coupling inductor 112A. As shown in FIG. 2, the flux bias current driven on the left side current bias I4 through L13 which is coupled to L6 sets a DC offset for the switch. The current driven by I3 through inductors L11 and L12 determines which output the signal is routed to by simultaneously counteracting the DC offset bias in one branch (for example, the top one) while pulling more current through the opposite branch (for example, the bottom one).

In an embodiment, each of the plurality of current branches 110 in an arm from the first port 102 to a second port 104 in the plurality of second ports 104 is configured to operate in a selected frequency range based on selected operating parameters. For example, the selected frequency range is from 4 GHz to 8 GHz.

Figure 4A:
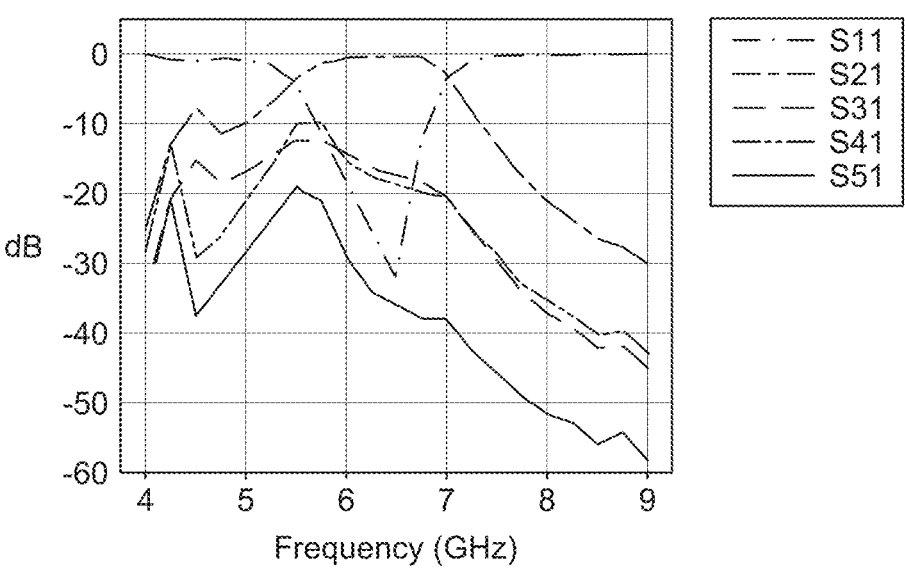
FIGS. 4A-4D show plots of results of simulation of scattering parameters versus frequency for a 1:4 circuit, i.e., one first port (e.g., input port) and 4 second ports (e.g., output ports), according to an embodiment of the present invention.
Figure 4B:
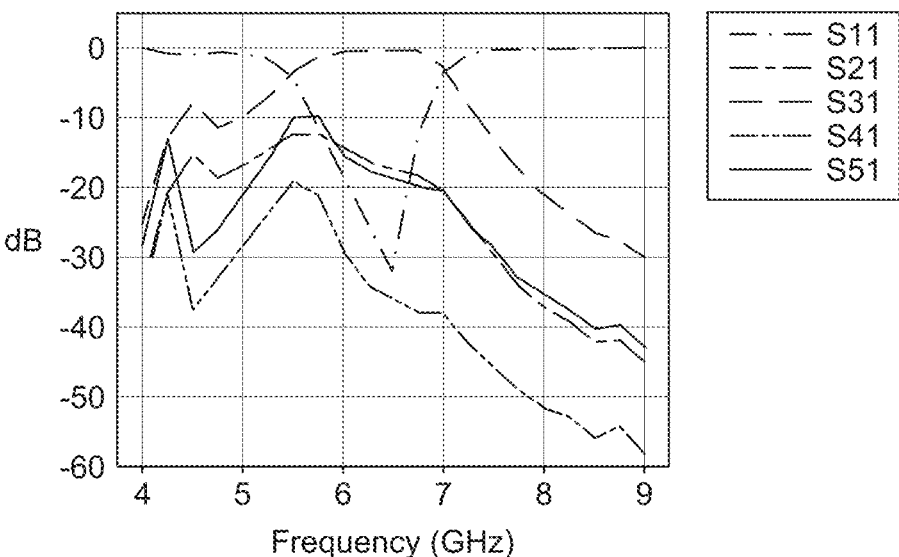
Figure 4C:
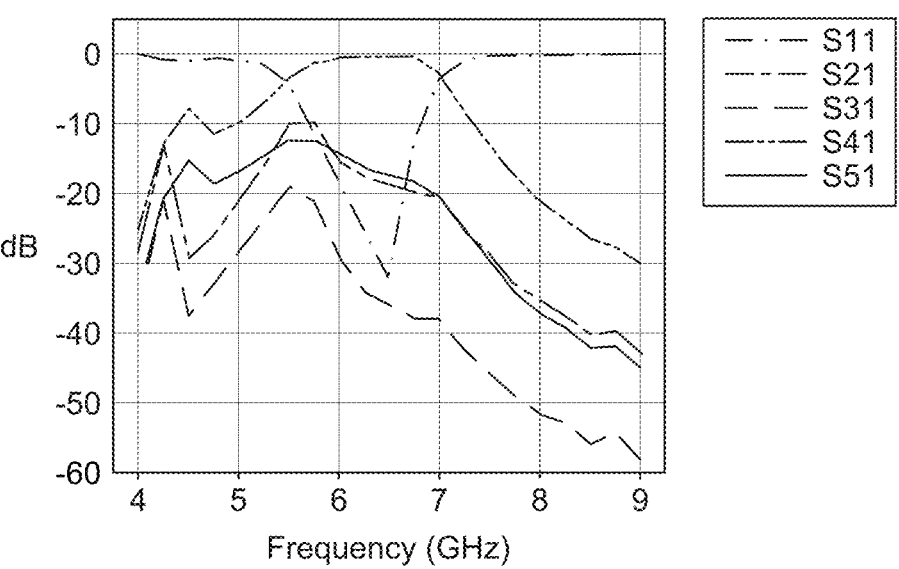
Figure 4D:
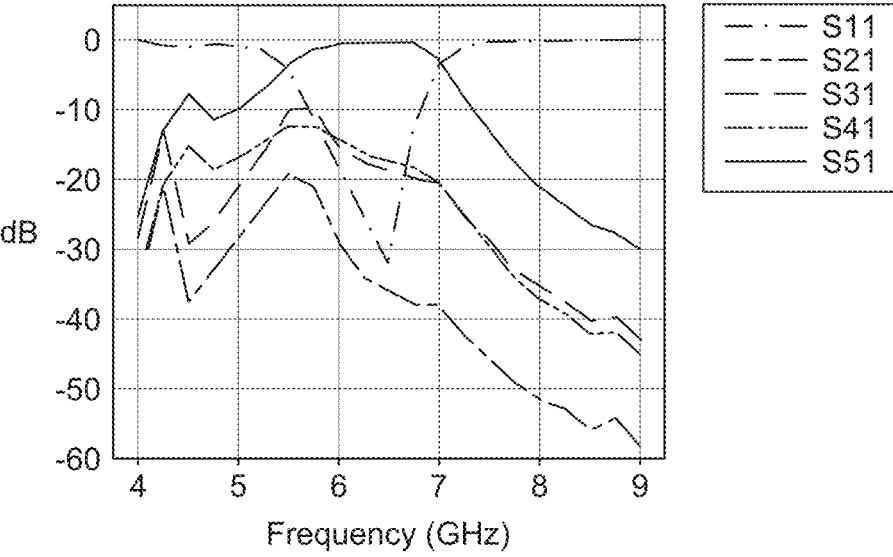

FIGS. 4A-4D show plots of results of simulation of scattering parameters versus frequency for a 1:4 circuit, i.e., one first port (e.g., input port) and 4 second ports (e.g., output ports), according to an embodiment of the present invention. The horizontal axis represents the frequency in GHz. The vertical axis in each plot represents a signal amplitude in dB. Each curve shows the scattering parameters for the various ports of the circuit, SXY represents the ratio of the output signal amplitude at port X to the input signal from port Y, i.e. S11 is the input port voltage reflection coefficient, S31 is the forward voltage gain at port 3, etc. FIG. 4A shows the switching or routing of the signal from port 1 to port 2 (i.e., S21 is turned ON while S31, S41 and S51 are turned OFF). FIG. 4B shows the switching or routing of the signal from port 1 to port 3 (i.e., S31 is turned ON while S21, S41 and S51 are turned OFF). FIG. 4C shows the switching or routing of the signal from port 1 to port 4. FIG. 4D shows the switching or routing of the signal from port 1 to port 5 (i.e., S41 is turned ON while S21, S31 and S41 are turned OFF).

Figure 5:
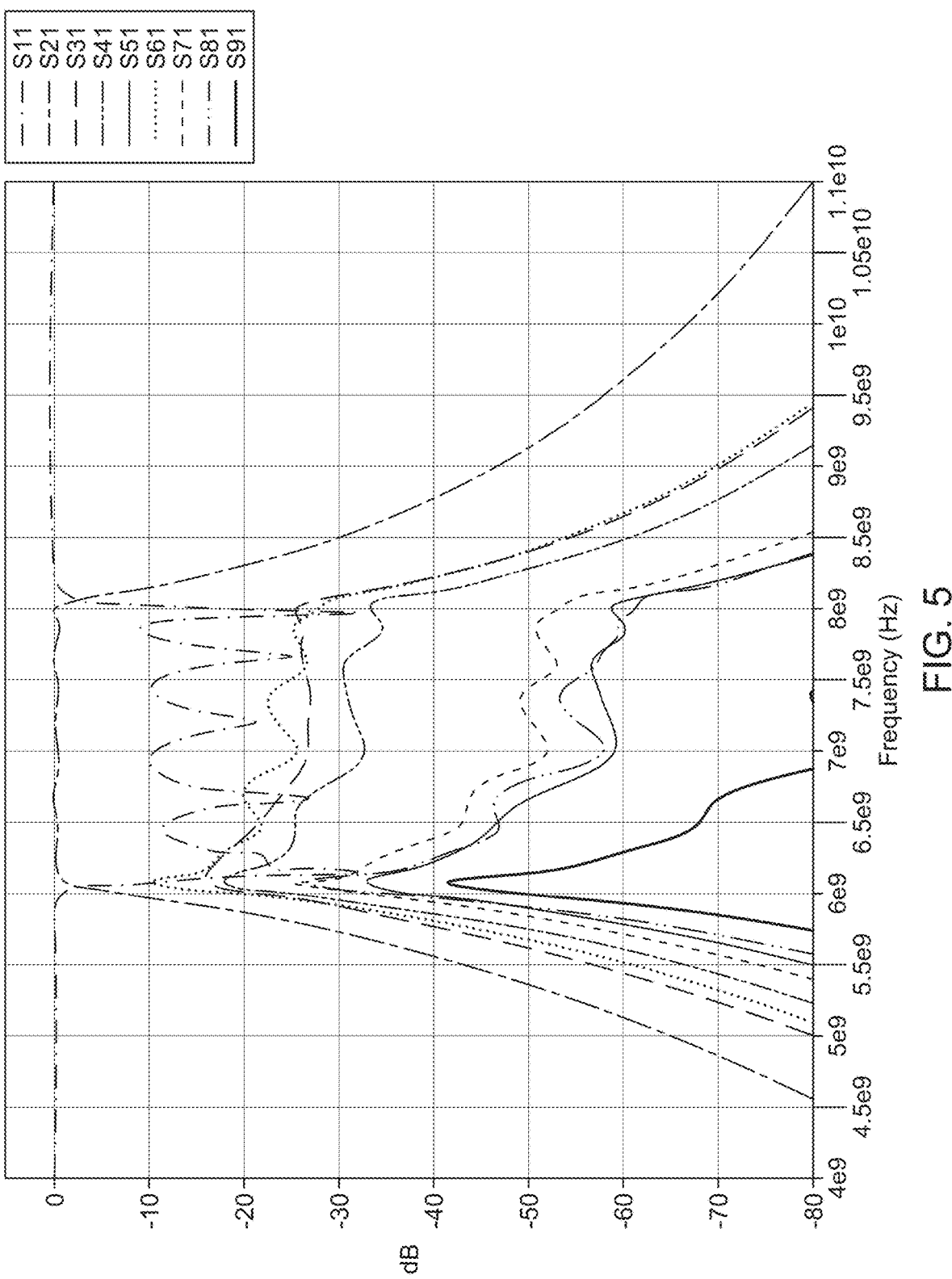
FIG. 5 shows plots of results of simulation of scattering parameters versus frequency for a 1:8 circuit such as the circuit shown in FIG. 1, i.e., one first port (e.g., input port) and 8 second ports (e.g., output ports), according to another embodiment of the present invention.

FIG. 5 shows plots of results of simulation of scattering parameters versus frequency for a 1:8 circuit, i.e., one first port (e.g., input port) and 8 second ports (e.g., output ports), according to another embodiment of the present invention. The horizontal axis represents the frequency in GHz. The vertical axis represents signal amplitude in dB. In this case, the switch is configured to allow the input signal to be predominately routed towards port 2, thus the near unity transmission between 6-8 GHz in curve S21, while the reflected signal shown in curve S11 is over 10 dB lower. The remaining outputs are in the OFF state as evidenced by the even lower signal response in the S31, S41, S51, S61, S71, S81 and S91 curves.

Although 1:4 and 1:8 switch circuits are illustrated herein, as it must be appreciated, the number of second ports is not limited to 4 or 8 ports only, but can be any number N of second ports (e.g., output ports) that is greater than 2. For example, a switch circuit 1:16 or even higher can also be fabricated using a specific number of filter poles as described in the above paragraphs.

Figure 6:
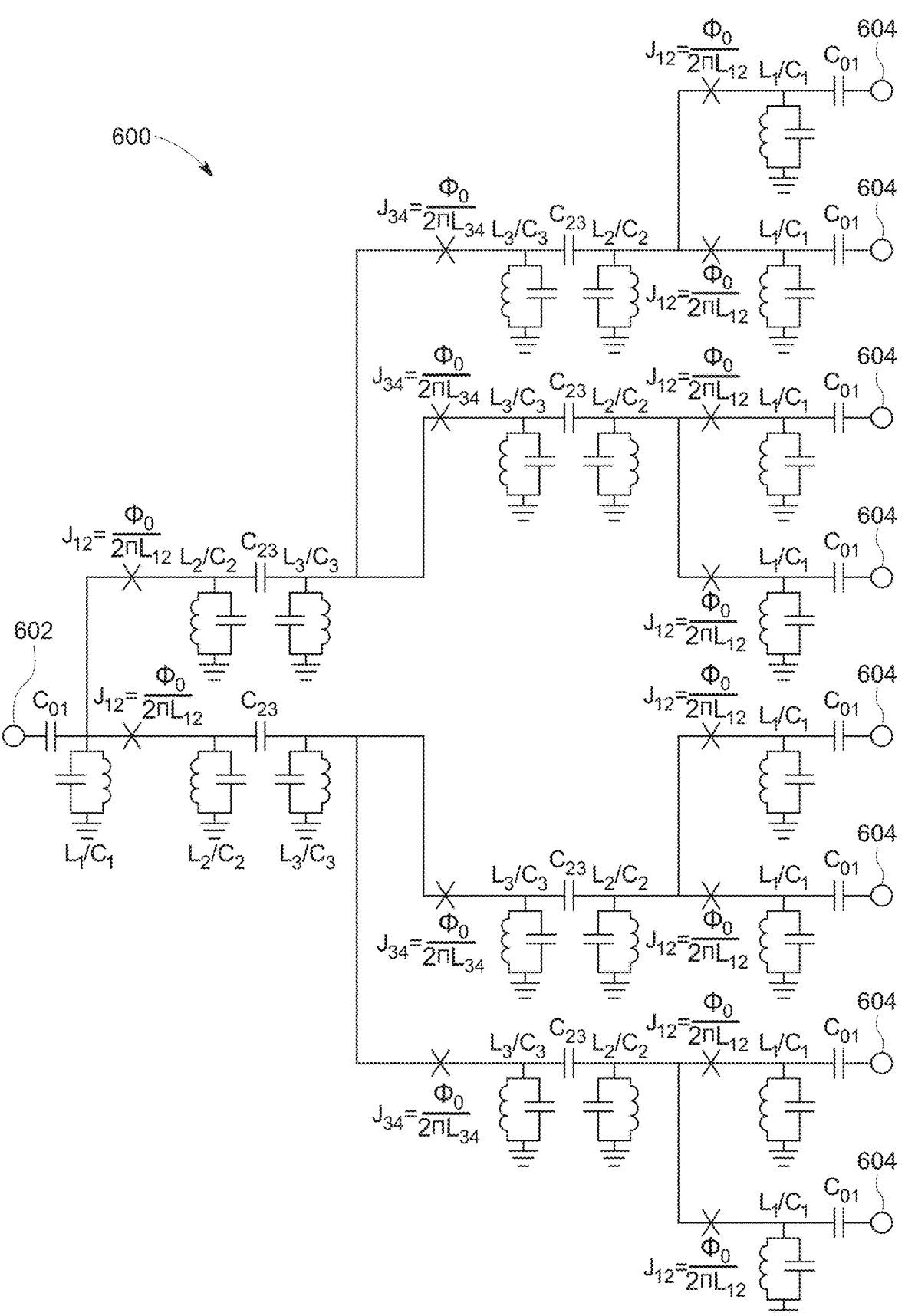
FIG. 6 is another electronic schematic of a superconducting circuit, according to an embodiment of the present invention.

FIG. 6 is another electronic schematic of a superconducting circuit, according to an embodiment of the present invention. The superconducting circuit 600 shown in FIG. 6 is similar to the superconducting circuit 100 shown in FIG. 1. However, the flux bias lines which are shown in FIG. 1 are not shown in FIG. 6 so as not to crowd the figure for the sake of clarity. Both circuit 100 and circuit 600 in this example are 1:8 switch circuits, i.e., circuits which can route a signal from one first port 602 (input port) to one of 8 second ports 604 (output ports) or circuits which can route a signal from one of the 8 second ports 604 (input port) to the first port 602 (output port). As shown in FIG. 6, for example in the upper arm (from the first port 602 to the upper second port 604) of the circuit 600 there are 6 filter poles. With six filter poles, 8 second ports (e.g., output ports) can be provided thus enabling a 1:8 fanout.

In general, for larger frequency bandwidths, the beta-L of some SQUIDS (Josephson junctions and inductors) tends to be greater than 1 making the circuit unusable. A superconducting quantum interference device (SQUID) loop includes the Josephson junction (JJ) 108J and the surrounding shunted pole inductors 106A. However, the circuit can be configured such that every pair of resonators has the substantially same impedance and reduce all SQUID beta-L's to be less than one. For example, if the impedances are adjusted such that every subsequent pair of resonators now have the same impedance, we can achieve beta-L's<1 for each of the SQUID loops thus allowing for the desired 1-8 fanout. For example, by selecting LC resonators 1, 2, 5 and 6 to have Z=15 and LC resonators 3 and 4 to have Z=2, we achieve the following circuit values:

'C01': 9.83 e-13 F,
'C2': 4.86 e-13 F,
'C3': 1.14 e-11 F,
'C1': 1.47 e-12 F,
'C23': 1.19 e-12 F,
'L12': 1.21 e-09 H,
'L1': 5.49 e-10 H,
'L2': 5.49 e-10 H,
'L34': 1.98 e-10 H,
'L3': 6.74 e-11 H.

This results in a beta-L for the SQUIDS towards the output and the input of the circuit of 0.91 and the SQUIDS in the middle of the circuit of 0.68. For example, in this calculation, the quoted values L1 and L2 (shown in FIG. 6) refer to inductors L6 and L10 shown in FIG. 2. Moreover, the connection between L12 and the Josephson Junction 108J is made to have the critical current. Beta-L can then be calculated as beta-L=(L6+L10)/L12=$2*pi*Ic(108J)*$(L6+L10)/$\Phi$0. In this example, the circuit is symmetric about $4^{th}$ admittance inverter so that LC poles 1, 2, 5, 6 match and LC poles 3 and 4 match in terms of their impedances.

In an embodiment, an impedance of the plurality of filter poles is selected such that a beta-L coefficient ($\beta$L) of each superconducting quantum interference device (SQUID) loop including the Josephson junction 108J and an inductor 112A is less than one, wherein $\beta_L = 2\pi * I_c * L / \Phi_0$, where L in this equation is the sum of all the geometric inductances that comprise the SQUID loop. In the example circuit shown in FIG. 2, L=L6+L11 for the top path and L=L6+L9 for the bottom path. $\Phi_0$ is a superconducting magnetic flux quantum. In an embodiment, the impedance at the first port 102, 602 (shown in FIG. 1 and FIG. 6, respectively) is matched with the impedance of each of the plurality of second ports 104, 604 (shown in FIG. 1 and FIG. 6, respectively). In another embodiment, the impedance at the first port 102, 602 is not matched with the impedances of each of the plurality of second ports 104, 604.

Because the Josephson junction-based switches and multiplexer-demultiplexer circuits can have zero internal power dissipation, relatively very low insertion loss, relatively wide bandwidth, and can be operated quickly, they can have an impact for future quantum computers. According to simulations of these devices, the Josephson junction-based switches can have the following characteristics:

1. Signal bandwidth between 4 and 8 GHz (but which can be designed for more a specific band if needed for the given application by selecting appropriate parameters of the circuit).
2. At least a 20 dB on/off ratio or even higher.
3. Fast (approximately 20 ns) toggling between switch channels.
4. operation for input signal powers around −120 dBm
5. Engineering for larger signal powers can also be implemented if desired with appropriate adjustment of circuit parameters.

Since the JJ circuit is embedded in a N-pole bandpass filter network it can be designed to match to input and output impedances other than 50 Ohms. The design of the filter network itself provides the impedance matching.

In an embodiment, the SQUID couplers are configured to achieve $\beta_L$<1 so as to avoid hysteresis. In addition, the beginning and terminating series capacitances can be selected to remain finite, which is valid for high impedance resonators. These two conditions can be satisfied simultaneously by selection of appropriate circuit parameters.

In an embodiment, the circuits described herein may include co-planar waveguide termination for proper impedance matching, which allows for modular construction of the (1-to-2) superconducting switch circuits to be cascaded into larger multistage multiplexers. Further, The DC bias lines can be share them among different stages of the circuit, thus reducing the number of DC flux lines needed to flux bias the circuit.

Figures 7A, 7B:
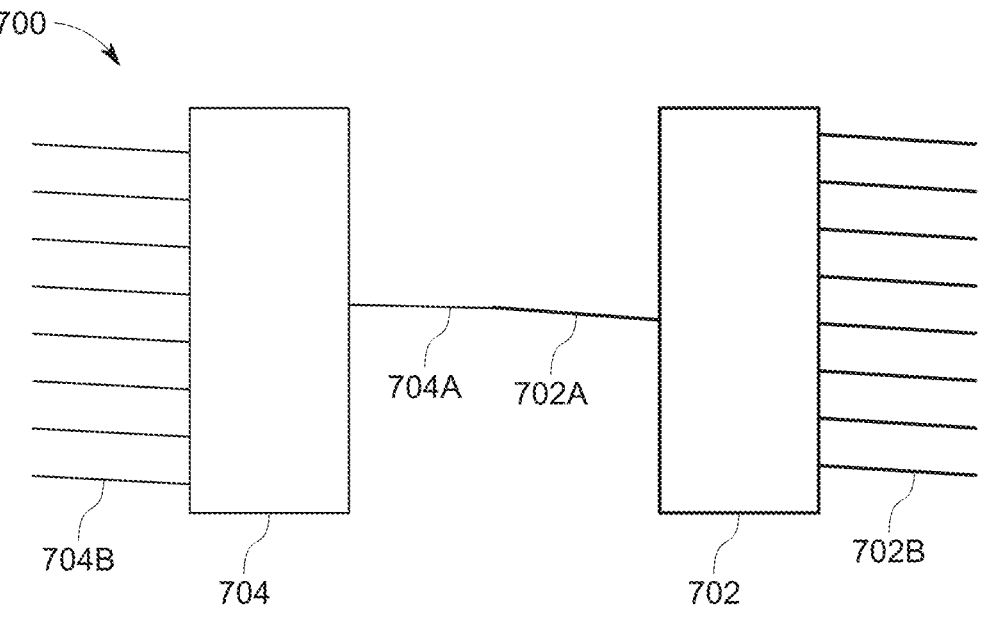
FIG. 7A shows a superconducting network circuit, according to an embodiment of the present invention.
FIG. 7B shows a superconducting network circuit, according to another embodiment of the present invention.

FIG. 7A shows a superconducting network circuit 700, according to an embodiment of the present invention. The network includes a first superconducting circuit 702 having a first port 702A and a plurality (N) of second ports 702B to provide a 1 to N switch configuration (1:N switch configuration). The network 700 also includes a second superconducting circuit 704 having a third port 704A and a plurality (M) of fourth ports 704B to provide a 1 to M switch configuration (1:M switch configuration). The first and second superconducting circuits 702, 704 are similar to the superconducting circuits 100, 600 described in detail in the above paragraphs. Therefore, the description of the various components of the circuits 702, 704 will not be repeated. The first port 702A of the first superconducting circuit 702 is connected to the third port 704A of the second superconducting circuit 704 so as to provide a M to N switch matrix. Although, the circuits 702 and 704 are shown having N=8 and M=8 ports, any number N and M ports (N>2 and M>2) can be provided. In addition, the numbers N and M can be equal or different. For example, an input signal input through one of the fourth ports 704B can be output through the third port 704A of the second superconducting circuit 704 which can then be input through the coupled first port 702A and routed to any one of the second ports 702B of the first superconducting circuit 702. In this way, any input signal input through any one of the fourth ports 704B can be routed to and output through any one of the second ports 702B as desired by controlling the switching dynamics of the superconducting circuits 702 and 704.

FIG. 7B shows a superconducting network circuit 701, according to an embodiment of the present invention. The network includes a first superconducting circuit 703 having a first port 703A and a plurality (N) of second ports 703B to provide a 1 to N switch configuration (1:N switch configuration). The network 701 also includes a second superconducting circuit 705 having a third port 705A and a plurality (M) of fourth ports 705B to provide a M to 1 switch configuration (M:1 switch configuration). The first and second superconducting circuits 703, 705 are similar to the superconducting circuits 100, 600 described in detail in the above paragraphs. Therefore, the description of the various components of the circuits 703, 705 will not be repeated. The plurality (N) of second port 703B of the first superconducting circuit 703 and the plurality (M) of the fourth ports 705B of the second superconducting circuit 705 are connected to a device under test (DUT) 707. For example, single first port 703A and single third port 705A can acts as input and output ports, respectively. Similar to circuit 700, although the circuits 703 and 705 are shown having N=8 and M=8 ports, any number N and M ports (N>2 and M>2) can be provided. The DUT can be any cryogenic hardware including, but not limited to, a qubit, qubit's readout resonators, tunable SQUID-like elements, or on-chip couplers used to tune qubits, for example.

Figure 8:
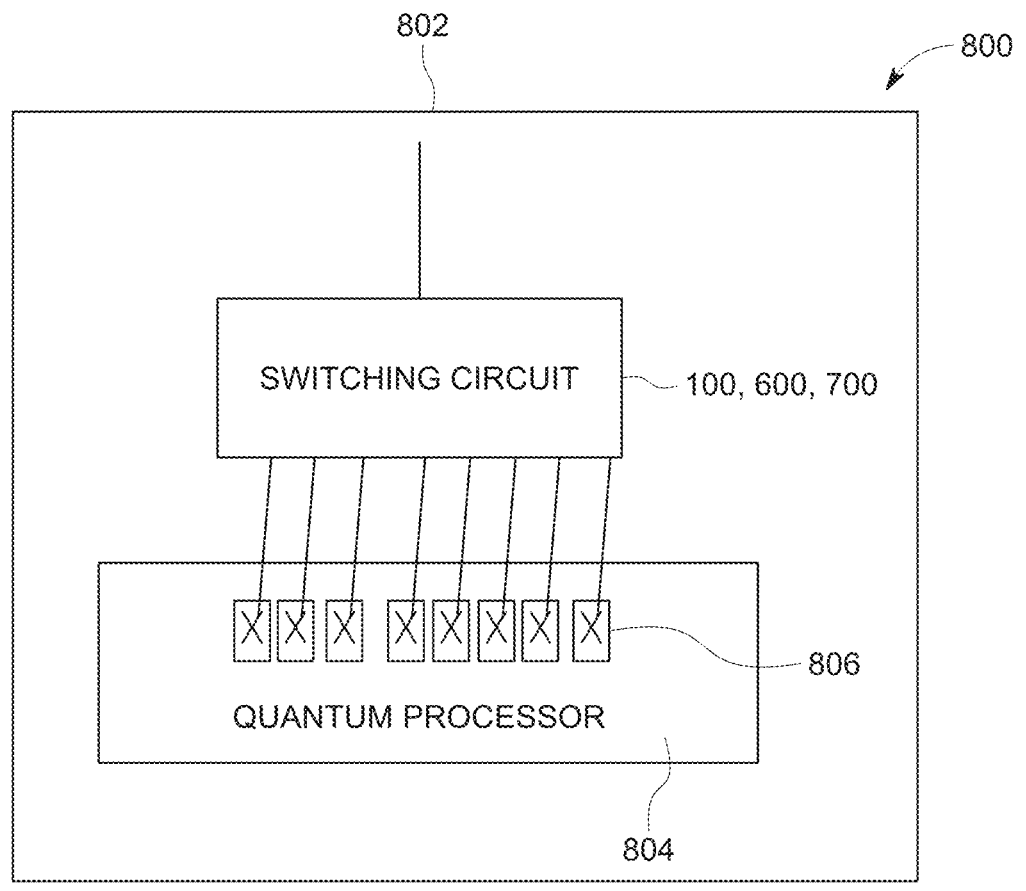
FIG. 8 is a schematic diagram of a superconducting quantum computer, according to an embodiment of the present invention.

FIG. 8 is a schematic diagram of a superconducting quantum computer 800, according to an embodiment of the present invention. The superconducting quantum computer 800 includes a refrigeration system comprising a temperature-controlled vessel 802. The superconducting quantum computer 800 also includes a quantum processor 804 disposed within the temperature-controlled vessel 802. The quantum processor 804 includes a plurality of qubits (X) 806. The superconducting quantum computer 800 further includes superconducting circuit 100, 600, 700 disposed inside the temperature-controlled vessel 802. The circuit 100, 600, 700 has a first port 102, 602, 702A, 704B and a plurality of second ports 104, 604, 702B. Each of the plurality of second ports 104, 604, 702B is connected to a corresponding qubit (X) of the plurality of qubits 806 to control or read a state of the corresponding qubit (X). In general, the second ports 104, 604, 702B (e.g., output ports) can also be connected to the qubits, the qubit's readout resonators, or to tunable SQUID-like elements or on-chip couplers used to tune the qubits.

In an embodiment, these superconducting switch circuits can enable a flexible and reconfigurable cryogenic test infrastructure that can help increase sample throughput of the testing of cryogenic hardware. Testing many devices in a single dilution refrigerator (temperature-controlled vessel 802) cool down can aid efforts to rapidly vet different designs, layouts, signal chains, etc. without warming up the mK plate or blowing out the devices during signal line switching.

In some embodiment, the described switch circuits can be used as a replacement for current off the shelf (COTS) switches in modern dilution refrigerator setups. Multiplexing can enable the readout of many channels and routing of the signals to high-electron mobility transistors (HEMT) amplifiers. This can in turn help reducing the number of wires, heat-load, to enable scaling-up the number of qubits in future quantum computers. In addition, the present circuit devices can help enable future integration of cryogenic microwave electronics and can eventually be integrated on chip with Travelling Wave Josephson Parametric amplifiers (TWPAs) or other Quantum Limited Amplifiers (QLAs). The possibility of reconfigurable isolation that can be performed dynamically, such as with the present JJ switches, opens up new possibilities for qubit experiments, such as scheduled readout sequences between different qubit chips that share common QLAs and readout infrastructure. Finally, cold isolating JJ switches at lower temperature stages (1K-10 mK) can also help reduce noise from the readout chain from influencing spectator qubits and improve multi-qubit device performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A superconducting circuit comprising:

a first port and a plurality of second ports;

a plurality of filter poles, each filter pole comprising an inductor and a capacitor connected in parallel, between the first port and a second port in the plurality of second ports, wherein the plurality of filter poles comprises greater than 2 filter poles;

an admittance inverter comprising at least one of a coupling capacitor, a coupling inductor, and a Josephson junction, the admittance inverter linking two successive filter poles together, wherein at least one filter pole of the plurality of filter poles together with the admittance inverter define a current branch (IB), and wherein a first configuration of the plurality of filter poles and a second configuration of the associated admittance inverters define a plurality of current branches so that:

the superconducting circuit is adapted such that an input electrical current input through the first port is routed to a selected one of the plurality of the plurality of second ports by an application of a first set of magnetic flux biases, wherein the single magnetic flux bias feeds and is connected to each of multiple ones of the plurality of filter poles for a defined stage; and the superconducting circuit is adapted such that an input electrical current input through any one of the plurality of second ports is routed as an output electrical current output through the first port by the application of a second set of magnetic flux biases, wherein the single magnetic flux bias feeds and is connected to each of multiple ones of the plurality of filter poles for the defined stage.

2. The circuit according to claim 1, wherein the first set magnetic flux biases is applied to match a current output through the selected one of the plurality of second ports to the current input through the first port, and all remaining not-selected ones of the plurality of second ports are mismatched from the first port and have essentially zero transmission.

3. The circuit according to claim 1, wherein the inductor and the capacitor in each filter pole are connected to electrical ground and to the Josephson junction and to the coupling capacitor of adjacent ones of the admittance inverters, and wherein the plurality of filter poles comprises 8 filter poles.

4. The circuit according to claim 3, wherein the coupling capacitor is configured to decouple, from direct current (DC), two filter poles of the plurality of filter poles.

5. The circuit according to claim 1, wherein the current branch comprises one filter pole or two filter poles of the plurality of filter poles, wherein the current branch is one of the plurality of current branches.

6. The circuit according to claim 1, wherein a number of second ports is dependent on a number of current branches.

7. The circuit according to claim 6, wherein the plurality of second ports is equal to N/2, where N−1 is a number of total current branches, wherein N is an even integer.

8. The circuit according to claim 1, wherein a number of the plurality of second ports is equal to 2 P/2, where P is a number of filter poles of the plurality of filter poles in an arm from the first port to a second port in the plurality of second ports, for an even number P of the plurality of filter poles.

9. The circuit according to claim 1, wherein the first port is connected to a first current branch having a first filter pole and each of the plurality of second ports is connected to a corresponding second current branch having a corresponding second pole.

10. The circuit according to claim 1, wherein the first port is connected to a first current branch via a first capacitor and each of the plurality of second ports is connected to a second current branch via a corresponding second capacitor, wherein the first current branch and the second current branch are ones of the plurality of current branches, and wherein the circuit comprises at least two intermediary branches of the plurality of current branches and the at least two intermediate branches are coupled to at least four of the plurality of current branches, wherein the at least four of the plurality of current branches are coupled to at least eight of the plurality of current branches.

11. The circuit according to claim 1, wherein each of the plurality of current branches in an arm from the first port to a second port in the plurality of second ports is structurally adapted to operate in a selected frequency range based on selected operating parameters.

12. The circuit according to claim 11, wherein the selected frequency range is from 4 GHz to 8 GHz.

13. The circuit according to claim 1, wherein based on a current being input through the first port, the current is selectively transmitted to a second port in the plurality of second ports by applying external flux biases.

14. The circuit according to claim 1, wherein an impedance of the plurality of filter poles is selected such that a beta-L coefficient (fk) of each superconducting quantum interference device (SQUID) loop including the Josephson junction and an inductor of a filter pole of the plurality of filter poles is less than one, wherein fk=21t*lc*L/<1>0, where L is the geometric inductance of the SQUID, Ic is the critical current of the coupling JJ, and <1>o is a superconducting magnetic flux quantum.

15. The circuit according to claim 1, wherein an impedance at the first port is matched with an impedance of each of the plurality of second ports.

16. The circuit according to claim 1, wherein an impedance at the first port is not matched with an impedance of each of the plurality of second ports.

* * * * *